United States Patent
Andersen et al.

(10) Patent No.: US 6,925,115 B1
(45) Date of Patent: Aug. 2, 2005

(54) APPARATUS AND METHOD FOR SAFELY HANDLING ASYCHRONOUS SHUTDOWN OF PULSEWIDTH MODULATED OUTPUT

(75) Inventors: Jack B. Andersen, Austin, TX (US); Wasim Quddus, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 158 days.

(21) Appl. No.: 10/328,281

(22) Filed: Dec. 23, 2002

(51) Int. Cl.[7] .............................. H03K 7/08; H03F 3/38
(52) U.S. Cl. .................. 375/238; 370/212; 329/312; 330/10; 332/109
(58) Field of Search .......................... 375/238, 247, 375/316; 370/212; 329/312; 332/109; 330/9, 330/10; 341/143

(56) References Cited

U.S. PATENT DOCUMENTS

| | | | | |
|---|---|---|---|---|
| 4,528,486 A | * | 7/1985 | Flaig et al. ................. | 318/254 |
| 5,617,058 A | * | 4/1997 | Adrian et al. ................. | 330/10 |
| 5,675,297 A | * | 10/1997 | Gose et al. ................. | 332/109 |
| 6,107,876 A | * | 8/2000 | O'Brien ........................ | 330/10 |
| 6,853,325 B2 | * | 2/2005 | Arizumi et al. ............... | 330/10 |

* cited by examiner

*Primary Examiner*—Young T. Tse
(74) *Attorney, Agent, or Firm*—Steven Lin, Esq.

(57) ABSTRACT

An apparatus and method for safely handling asynchronous shutdown of pulsewidth modulated output. A shutdown circuit controls asynchronous shutdown of a pulsewidth modulated stage to ensure that pulsewidth modulated signals of less duration than a minimum period does not occur at transition edges of the pulsewidth modulated signal, in which such short pulses may affect the proper operation of output circuitry.

19 Claims, 5 Drawing Sheets

APPARATUS AND METHOD FOR SAFELY HANDLING ASYCHRONOUS SHUTDOWN OF PULSEWIDTH MODULATED OUTPUT

FIELD OF THE INVENTION

The present invention relates to control of pulsewidth modulated devices and, more specifically, to ensuring a safe shutdown of the pulsewidth modulated devices.

BACKGROUND OF THE RELATED ART

The use of switched mode output stage(s) in audio amplification, in which the conversion is digitally performed, allows audio output from digital signal input. The digital signal conversion may be achieved by a variety of devices. One particular technique utilizes a delta-sigma (ΔΣ) modulator, in which the digital input signal is filtered and then quantized to produce an audio output. In one switched technique, the noise-shaped quantized signal from the quantizer is coupled to a pulsewidth modulator (PWM), in which a value of the quantized signal controls the duty cycle of the PWM output. The PWM output then controls the operation of a switching device utilized as the output stage of an amplifier to drive a load. Thus, the filtered digital signal is utilized to modulate the pulsewidth of the PWM signal to control the duration of the switch on/off time of the output drive stage to the load.

For PWM driven outputs, the output may need to be switched off when certain situations occur. Typically, an error in the output circuit may indicate the potential for harm to the circuit. For example, the error may be in the form of operating the output device outside their safe operating limits with respect to a certain circuit parameter(s), such as excessive voltage, current, and/or temperature. A variety of circuits may be implemented to monitor and detect the various error conditions that may affect the performance of the output stage of an amplifier, including conditions that may pose potential damage to the amplifier. These detection circuits may then generate a shutdown signal to shutdown the output drive if an undesirable condition exists and/or persists.

However, when the shutdown occurs asynchronously to the timing of the PWM pulse, a potential danger exists for generating shutdown pulses shorter than the minimum width required to control the output devices. This situation is due to some amount of minimum pulse duration generally needed for properly turning on/off of the output driver transistors. If the shutdown is activated immediately after the rising edge or if the shutdown is released immediately before the falling edge of the PWM signal controlling the output stage, the shutdown control signal may result in the generation of an improper PWM signal to drive the load. An improper PWM signal of insufficient duration may not drive the output stage correctly and/or may place the output stage in some other state than the desired state. Accordingly, when shutdown of PWM circuitry is dependent on an asynchronous signal, some form of timing control may be needed to ensure that PWM signals of less than minimum selected pulse duration are not generated to control the output drive stage of an amplifier, such as an audio amplifier.

SUMMARY OF THE EMBODIMENTS OF THE INVENTION

An apparatus and method for safely handling asynchronous shutdown of pulsewidth modulated output is described. A shutdown circuit receives the pulsewidth modulated signal and determines a commencement of a signal transition at the start of the pulse. The shutdown circuit also determines a minimum period after the commencement of the signal transition. When the shutdown circuit receives a shutdown signal to initiate a shutdown of the drive to an output stage, the shutdown circuit delays the shutdown until the minimum period following the commencement of the signal transition has lapsed. In controlling the release of the shutdown at the end of the pulse, the shutdown of the output continues at least until the pulsewidth modulated signal has transitioned back to the non-pulsed state even if the shutdown signal has terminated. The control of the asynchronous shutdown ensures that pulsewidth modulated signals of less duration than the minimum period does not occur, in which such short pulses may affect the proper operation of output circuitry.

BRIEF DESCRIPTION OF THE DRAWINGS

Embodiments of the present invention are illustrated by way of example and not for the purpose of limitation. In the Figures of the accompanying drawings, similar references are utilized to indicate similar elements.

DETAILED DESCRIPTION OF THE INVENTION

Figure 1:
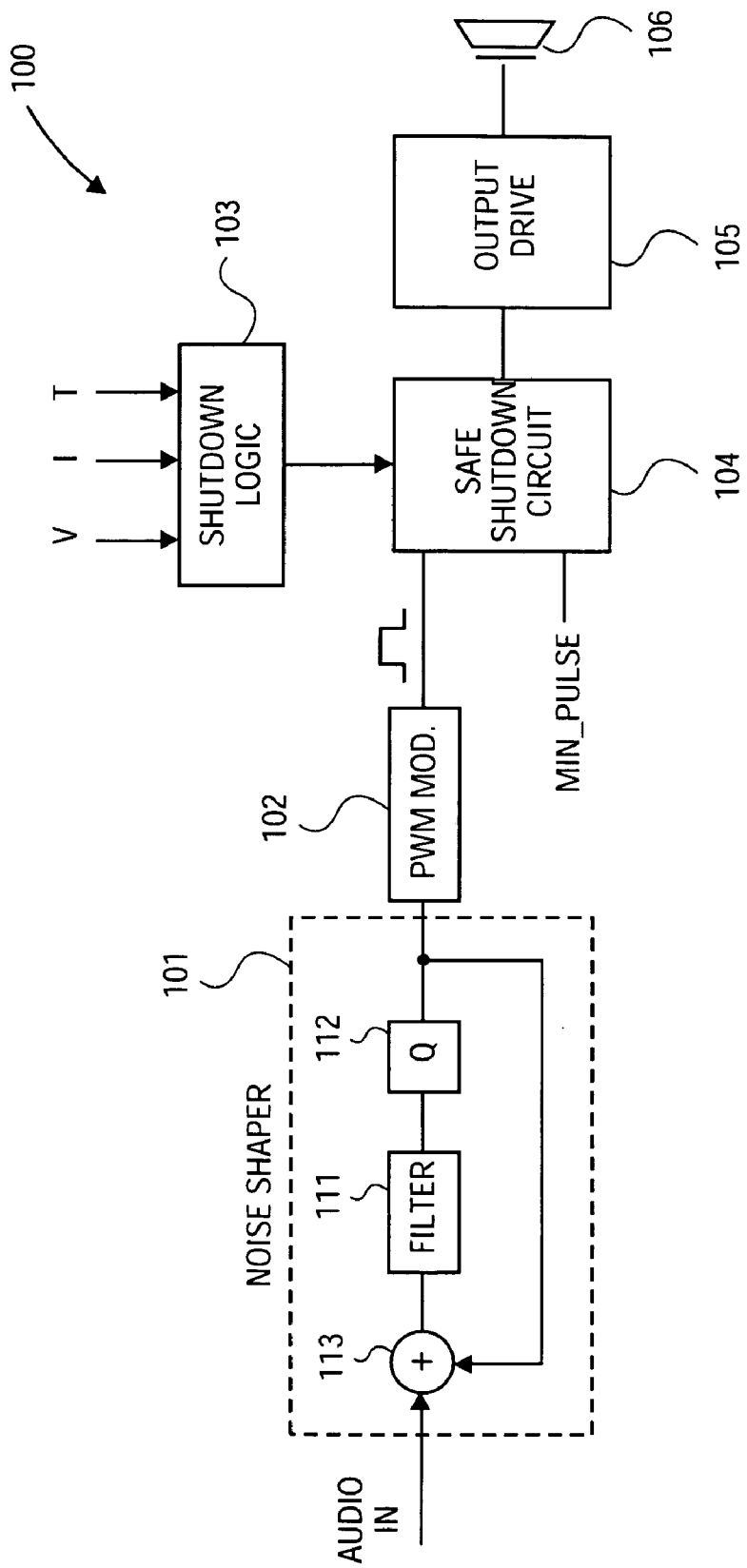
FIG. 1 shows a circuit block diagram of an embodiment of a PWM amplifier utilizing an asynchronous shutdown circuit to safely handle shutdowns.

Referring to FIG. 1, a circuit block diagram is shown in which an asynchronous shutdown scheme is implemented as one embodiment of the present invention. The particular embodiment of the invention is described in reference to a pulsewidth modulator utilized in audio applications to drive a load. In FIG. 1, a circuit 100 is shown having a noise shaper stage ("noise shaper") 101, pulse width modulation modulator stage ("PWM modulator") 102, a shutdown detector logic stage ("shutdown logic") 103, a safe shutdown stage ("shutdown circuit") 104, and an output drive stage ("output driver") 105. The input to circuit 100 is typically a digital audio signal, which is received at the input of noise shaper 101. The output from circuit 100 is provided by output driver 105, from which an amplified audio signal drives a peripheral device, such as an audio speaker ("load") 106.

In the particular embodiment shown, a digital audio signal is input to noise shaper 101, and the digital audio signal is filtered and quantized so that a quantized digital audio signal is provided at the output of noise shaper 101. Although a variety of noise shaper circuits may be utilized, noise shaper 101 utilizes a filter 111 and a quantizer 112. The quantized signal generated at the output of noise shaper 101 is a noise-shaped signal, which drives modulator 102. The output signal from quantizer 112 is also fed back to the input of filter 111 through a summation node 113. The fed back signal is combined with the digital audio input signal at summation node 113. In one particular embodiment, node 113, filter 111, and quantizer 112 are utilized as a delta-sigma (ΔΣ) stage to convert the digital audio signal to a noise-shaped signal. Filter 111 is typically a low-pass ("LP") filter for filtering the digital audio signal, and quantizer 112 generates the noise-shaped output signal. The noise-shaped signal corresponds to the input digital signal to be used as a modulation signal to drive PWM modulator 102. A variety of ΔΣ stages may be readily adapted for use in noise shaper 101.

Although a variety of modulators may be used, the embodiment shown in circuit 100 utilizes a pulsewidth modulator (PWM) to generate a pulse signal, in which the duration of the pulse is controlled by the noise-shaped signal from noise shaper 101. Accordingly, the audio digital signal at the input of noise shaper 101 essentially controls the pulse duration (pulsewidth) of the PWM signal from PWM modulator 102. The modulator output is then coupled to safe shutdown circuit 104, in which the modulator output signal is further processed. The output signal from shutdown circuit 104 is defined as a qualified PWM output signal since the PWM signal may be adjusted based on the state and timing of the shutdown signal from shutdown logic 103. The qualified PWM output signal is then used to drive output driver 105.

As will be described in detail below, shutdown circuit 104 receives a shutdown control signal from shutdown detector logic 103. Shutdown circuit 104 also receives a minimum pulse input value to control the minimum timing requirement for safe shutdown of output driver 105. The shutdown logic 103 monitors one or more circuits and/or environmental parameters and detects when a shutdown condition is to be initiated. In the particular embodiment shown, shutdown logic 103 receives voltage, current, and temperature inputs so that one or more of the voltage, current, and temperature values may be monitored and utilized to detect a condition or potential condition that may be a concern for the operation of circuit 100. Typically, the concern is to a safe operation of driver 105. For example, voltage may be monitored for an over-voltage condition, which may harm output transistors. Likewise, excessive heat or current may cause an over-current condition in the output drive. In these instances, permanent or temporary shutdown of the output power stage may be initiated to prevent damage to the output circuit or to devices (such as an external load) driven by the output stage. Parameters other than voltage, current, and temperature may also be monitored and/or detected.

Accordingly, when such a condition or potential condition is detected, shutdown logic 103 generates a shutdown signal, that is provided to shutdown circuit 104. When shutdown circuit 104 receives the shutdown signal, shutdown circuit 104, in turn, causes output driver 105 to be shutdown pursuant to certain constraints built in to shutdown circuit 104. In the particular embodiment described below, shutdown circuit 104 monitors both the PWM signal from PWM modulator 102 and the shutdown signal from shutdown logic 103 and pursues a response in accordance with providing asynchronous safe shutdown of output driver 105.

Figure 2:
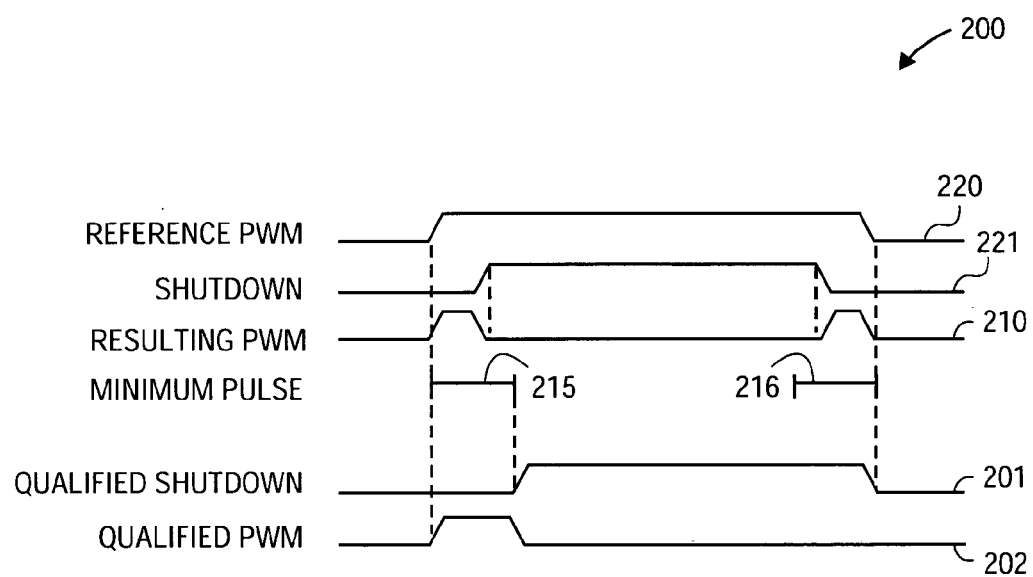
FIG. 2 shows a waveform diagram of various PWM and shutdown signals for the shutdown circuit of FIG. 1.

Referring to FIG. 2, a waveform diagram 200 is shown for the generation of a qualified shutdown signal 201 to generate a qualified PWM signal 202. A problem with asynchronous shutdown is shown in an illustrative PWM signal 210 that would be generated if shutdown circuit 104 is not utilized employed A PWM signal typically modulates the drive of an output device. Typically, these drivers are high power devices. One such example is the use of Field-Effect-Transistors (FETs) in which the FETs are gate driven. To ensure proper response (turning on/off) of the FETs, the drive pulse to the gates of the FETs need to meet or exceed a minimum pulsewidth duration. PWM pulses shorter than the minimum pulsewidth duration may not guarantee that the FETs fully turn on or off. Accordingly, PWM signals to output driver 105 should have the safe minimum pulsewidth duration. If the minimum duration is not present or cannot be guaranteed, then the PWM signal need not be generated. The minimum PWM pulsewidth requirement ensures that potentially harmful drive signals are not sent to driver stage 105 since these potentially harmful drive signals may cause driver 105 to not turn off fast enough to avoid excessive current and potential damage.

In FIG. 2, the output from PWM modulator 102 is depicted as a reference PWM signal 220, and the shutdown signal from shutdown logic 103 is depicted as an asynchronous shutdown signal 221. Also shown are minimum pulse period 215 at the commencement of reference PWM signal 220 and minimum pulse period 216 at the end of the reference PWM signal 220. The two periods 215, 216 exemplify the minimum time desired before there is again a change in the state of the reference PWM signal 220. Accordingly, once the reference PWM signal 220 transitions (low to high in the example shown in FIG. 2), the reference PWM signal 220 should not transition again for minimum period 215 in order to ensure proper turn on/off of the devices in the driver stage 105. Likewise at the other end, reference PWM signal 220 should not transition twice within period 216. Generally for most applications, time periods 215 and 216 are about equal, even though they do not have to be.

In FIG. 2, shutdown signal 221 is utilized to shutdown the drive stage 105. Shutdown signal 221 may be asynchronous so that shutdown signal 221 may occur at any point of time in relation to reference PWM 220. Illustrative PWM signal 210 exemplifies the situation when shutdown signal 221 occurs within minimum period 215 after PWM signal 220 activates (transitioning high in the example) and also the situation when the shutdown signal 221 terminates within minimum period 216 prior to PWM signal 220 transitioning low. If either of these situations occur, then a PWM signal sent to output driver 105 may have a pulse duration of less than the desired minimum. The undesirable PWM pulses are shown in illustrative PWM signal 210. Accordingly, if the shutdown signal 221 commences within the minimum pulse period 215 after the commencement of the rising edge of the reference PWM signal 220, then PWM signal 210 will have a first pulse with a duration shorter than the required minimum pulse period 215. Similarly, if shutdown signal 221 goes low followed by reference PWM signal 220 going low, then the second pulse of the PWM signal may have a duration shorter than the required minimum period 216.

Thus, one or both conditions may be exhibited if the asynchronous shutdown signal 221 commences after the rising edge of reference PWM signal 220 from modulator 102 and the timing separation of the two transitions are less than the minimum pulse period 215. Likewise, at the tail end, when shutdown signal 221 goes low prior to reference PWM signal 220 going low, a short PWM duration may also occur if the timing separation of shutdown signal 221 and reference PWM signal 220 is less than the timing duration 216. Therefore, when the shutdown occurs asynchronously to the PWM pulse, a potential danger of generating output PWM pulses shorter than the minimum width required exists, such as when the shutdown is activated shortly after the rising edge or when the shutdown is released shortly before the falling edge of the reference PWM signal. "Shortly" is defined as the occurrence of the rising or falling edge of the shutdown signal within the minimum pulse duration 215/216. In order to ensure that the resulting pulsewidth is at least the minimum duration 215/216, a qualified shutdown signal 201 is generated to replace reference PWM signal 220 to control the PWM drive to output driver 105.

In order to address the problem at the rising edge, one exemplary solution is to activate qualified shutdown signal 201 as soon as the shutdown occurs except within the time period 215. If shutdown signal 221 is initiated within period 215, then qualified shutdown signal 201 is not initiated until after period 215 has lapsed. Thus, as shown in FIG. 2, the rising edge of qualified shutdown signal 201 does not occur until the minimum time period 215 has lapsed. Once the minimum time period 215 has lapsed, qualified shutdown signal 201 is allowed to go high, which then results in qualified PWM signal 201 at the output of shutdown circuit 104 to go low.

An exemplary solution to the problem at the falling edge is to not release qualified shutdown signal 201 until reference PWM signal 220 goes low. Accordingly, even though shutdown signal 221 goes low, qualified shutdown signal 201 remains high until reference PWM signal 220 goes low. Qualified PWM signal 201 is then utilized to control the timing of the shutdown so that qualified PWM signal 202 that is sent from shutdown circuit 104 is in response to qualified shutdown signal 201. Thus, in the exemplary waveform of qualified PWM signal 202, only one active pulse is shown (verses two for the uncompensated waveform 210). The one pulse of qualified PWM output signal 202 has a pulsewidth of at least the established minimum time period 215.

Figure 3:
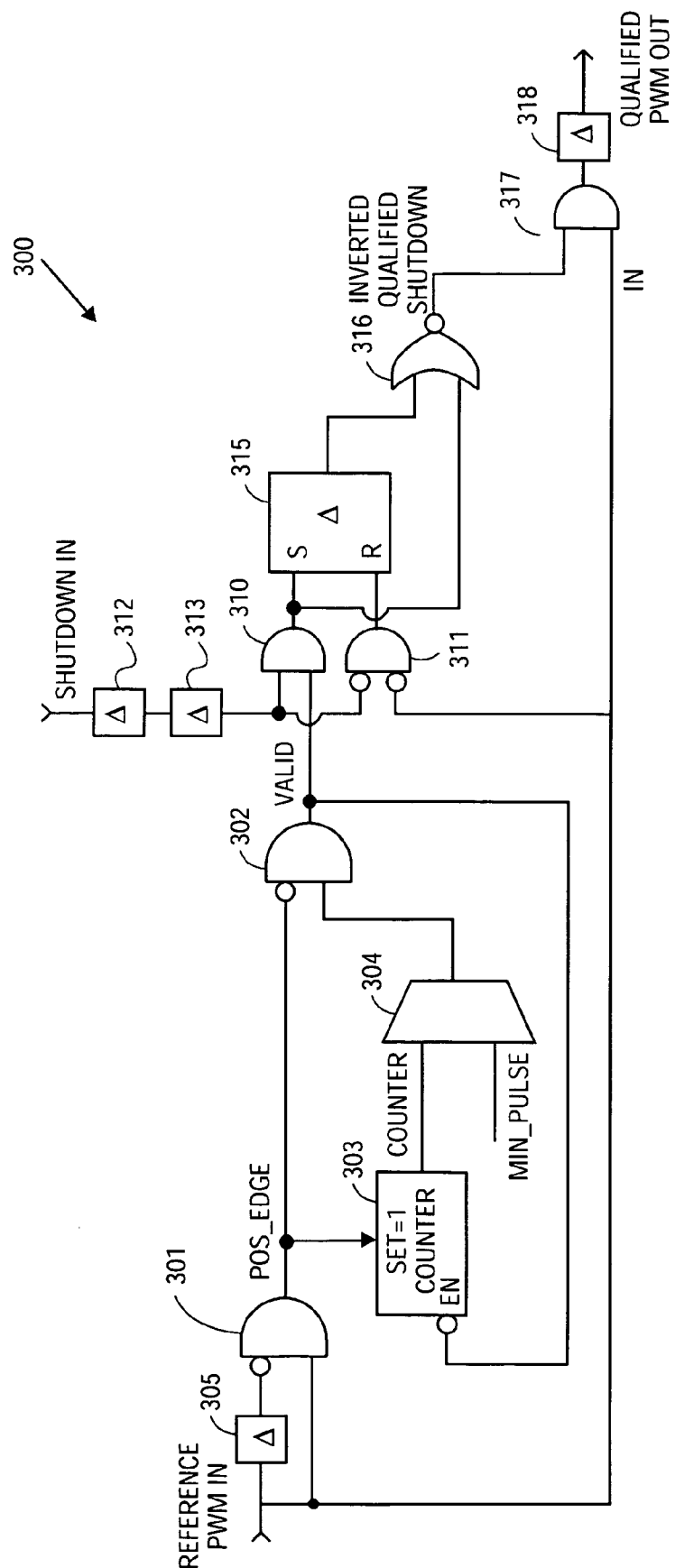
FIG. 3 shows an exemplary embodiment of one circuit that may be implemented for the shutdown circuit of FIG. 1.

One exemplary circuit 300 for shutdown circuit 104 is illustrated in FIG. 3. Circuit 300 receives reference PWM signal from PWM modulator 102 and shutdown signal from shutdown logic 103. A first portion of circuit 300 generates a VALID signal, which is then used in combination with the shutdown signal to generate the qualified shutdown signal in a second portion of the circuit 300. FIG. 3 also shows the second portion providing an inverted qualified shutdown signal (complement of the shutdown signal). The inverted qualified shutdown signal is then combined with the reference PWM signal to generate the qualified PWM signal utilized to drive output driver 105.

The reference PWM signal is split and input to one input of an AND gate 301. A second input of AND gate 301 receives a delayed and inverted reference PWM signal. Delay element 305 (delay is shown by "a") provides the delay. The delay, in this instance, is a clock cycle delay (a delay of one clock cycle wide pulse). Exemplary circuit 300 has a number of delay elements (such as delay elements 305, 312, 313 and 318). A clocking circuit connection is not shown, but these delay elements 305, 312, 313, and 318 and counter 303 and S-R flip-flop 315 are generally clocked by a synchronous clock signal. In one embodiment, this synchronous clock signal is the same clock signal (pwm_clk) utilized to clock the timing of the PWM pulse. Thus, the delay elements present a synchronous clocked implementation for providing the various delays.

In the description below, a synchronous implementation is described in reference to circuit 300. Accordingly, with the synchronous implementation, AND gate 301 generates a clock cycle delay whenever the reference PWM signal changes states. The output signal from AND gate 301 (shown as POS_EDGE) is sent to an inverted input of an AND gate 302. POS_EDGE is also sent to set a counter 303. Comparator 304 compares the output of counter 303 with a value corresponding to the minimum pulse (MIN_PULSE) (e.g., minimum duration for a pulse of PWM signal 210), and the comparison output signal from counter 304 is sent to a second input of AND gate 302. The output signal from AND gate 302 is the VALID signal, which is also inverted and fed back to an enable input of counter 303 to enable the counter. Synchronous clocking signal (such as pwm_clk) is not shown in the diagram of circuit 300 but is present to provide the synchronous clocking and to allow counter 303 to count once counter 303 is set.

The VALID signal is always high except when it is not valid to initiate the shutdown (e.g., during the minimum period following the high transition of the reference PWM signal). The minimum period is determined by selecting a value for MIN_PULSE, which is input to comparator 304 for comparison with the output of counter 303. A positive edge at the input triggers a one-clock cycle wide pulse shown as POS_EDGE. The POS_EDGE pulse causes the VALID signal to go low enabling counter 303. On the next clock edge, counter 303 is synchronously set to 1 to initialize the count sequence. The counter 303 commences to count with the clock cycle, and comparator 304 compares the output of counter 303 with the value of MIN_PULSE. The output of the comparison and the inverted POS_EDGE signal are sent to AND gate 302 to generate the VALID signal. Once counter 303 is enabled, the counter output (COUNTER) is compared with the count value selected for MIN_PULSE. Comparator output from AND gate 302 is low to keep the VALID value low until the COUNTER reaches the value of MIN_PULSE, at which time comparator 304 output changes forcing VALID to high again. At this point, the minimum period (set by MIN_PULSE) has lapsed, and VALID goes high so that shutdown may be initiated. When VALID goes high again, counter 303 is disabled.

The second part of the circuit 300 then uses the VALID signal and generates the inverted qualified shutdown signal in combination with the shutdown signal. As shown, the shutdown signal and the VALID signal are input to an AND gate 310. The shutdown signal and the reference PWM signal are inverted and input to an AND gate 311. Two delay elements 312, 313 are employed to synchronize the sampling of the asynchronous shutdown signal and to remove meta-stability. In asynchronous implementations, such synchronizing elements are generally not used.

The output of AND gate 310 is sent to a set ("S") input of S-R flip-flop 315 while the output of AND gate 311 is sent to the reset ("R") input of flip-flop 315. In synchronous implementation, S-R flip-flop 315 is clocked, such as by pwm_clk. In the particular embodiment of circuit 300, when the output of gate 310 is a logic high (1), the output of flip-flop 315 is set to one (1) with the next positive edge of pwm_clk. Similarly, when the output of gate 311 is a logic high (1), the output of flip-flop 315 is a logic low (0) with the next positive edge of pwm_clk.

The output of flip-flop 315 and the output of AND gate 310 are input to a NOR gate 316. The output of NOR gate 316 provides the inverted qualified shutdown signal, and this signal and the reference PWM signal are input to an AND gate 317. This connection from gate 310 to NOR gate 316 around S-R flip-flop 315 enables circuit 300 to speed up the response to an active shutdown signal. In other embodiments, this connection may be omitted to save some logic at the cost of one additional clock cycle of delayed response to a shutdown.

The output of AND gate 317 is the qualified PWM signal that is sent to output driver 105. A delay element 318 is used at the output of AND gate 317. In one particular embodiment, delay element 318 is a "deglitch" D-type flip-flop.

The shutdown signal is typically generated external to shutdown circuit 300, such as by shutdown logic 103, and the shutdown signal is usually generated asynchronously to the clock of the PWM circuitry. The double gate delay minimizes risk of meta-stability. The VALID signal synchronizes the asynchronous shutdown signal and ensures when shutdown is enabled. When the synchronized shutdown signal VALID is high signifying shutdown is permitted, synchronous S-R flip-flop 315 is set on the next clock edge. The output of flip-flop 315, as well as the S-input, are input to NOR gate 316 to generate the inverted qualified shutdown signal. The S-R flip-flop 315 is reset only when VALID goes low and the reference PWM input goes low.

Thus, when shutdown is activated and VALID is high, the set signal drives the inverted qualified shutdown signal low so that the state of the input reference PWM signal is output from circuit 300. After the first clock cycle S-R flip-flop 315 is set to maintain the inverted qualified shutdown signal low until it is permissible to release it. The qualified PWM signal stays high as long as the input reference signal stays high (no matter the state of the shutdown signal). The qualified PWM signal goes low when the inverted qualified shutdown signal and the reference PWM input signal are both low. Flip-flop 315 ensures that no logic race condition generates spikes on the output.

The waveform diagrams of FIG. 2 are achieved with the operation of circuit 300. The qualified shutdown signal 201 is actually an inverted signal at the output of NOR gate 316. This inversion is due simply to the designed logic of the various logic devices of circuit 300.

Figure 4:
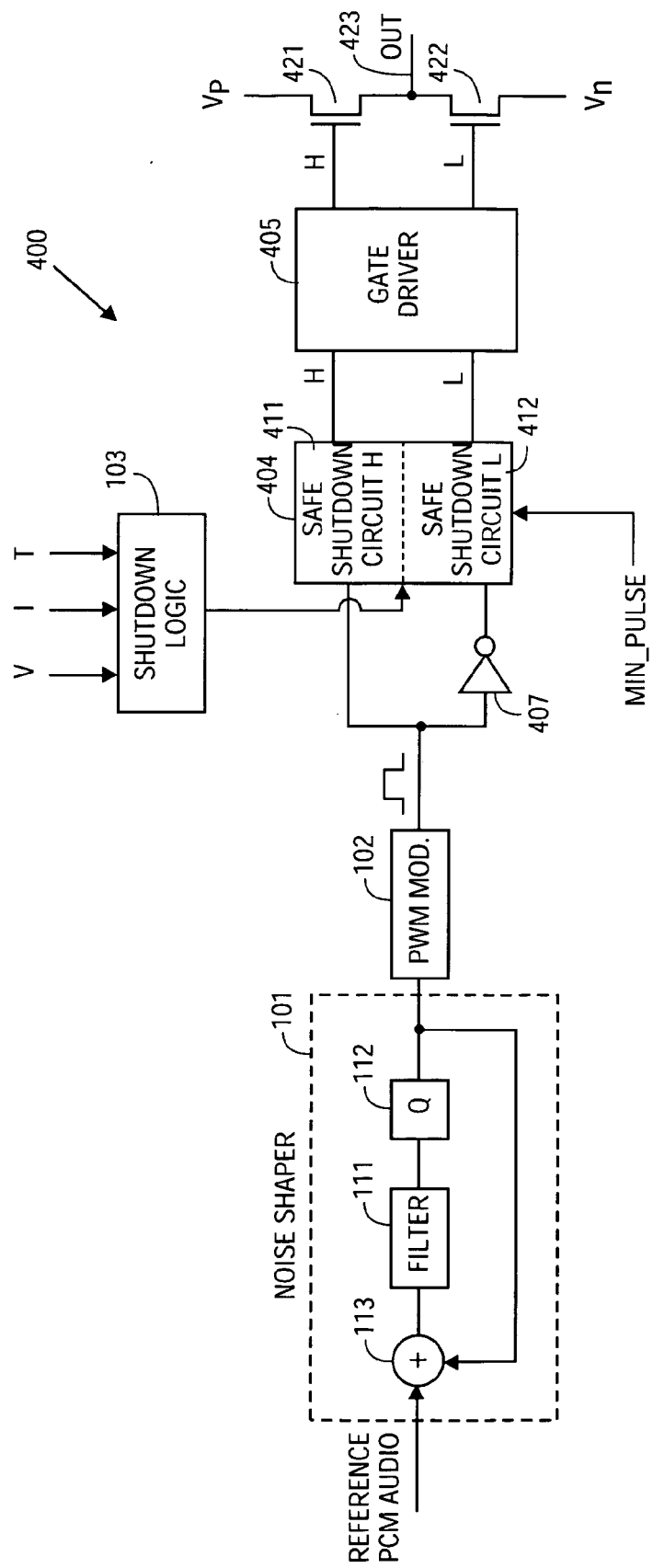
FIG. 4 shows a circuit block diagram of an alternative embodiment for providing a safe shutdown to a complementary pair of switching transistors.

FIG. 4 shows an embodiment in which a complementary set of PWM high and low side drive signals are utilized to drive a complementary pair of transistors 421, 422. A safe shutdown circuit 400 is shown, in which circuit 400 operates equivalently to circuit 100 but now drives a complementary set of transistors 421, 422. The complementary pair of transistors 421, 422 are driven by complementary signals indicated as high ("H") and low ("L") from gate driver 405 to switch output line 423 between Vp (H side) and Vn (L side). Noise shaper 101 and PWM modulator 102 of FIG. 1 are again utilized to generate the reference PWM signal. Shutdown logic 103 of FIG. 1 is also utilized to generate the shutdown signal based on certain circuit and/or environmental parameters. The reference PWM signal is split to provide a non-inverted (H side) and inverted (L side) PWM signal to a shutdown circuit 404. In FIG. 4, inverter 407 provides the inversion. The shutdown signal from shutdown logic is also input to shutdown circuit 404.

Shutdown circuit 404 has two sections 411 and 412, also shown as safe shutdown circuit H and safe shutdown circuit L. Sections 411, 412 both use the shutdown signal. Section 411 and section 412 individually and equivalently operate to shutdown circuit 104 except that L section 412 operates in inverse to H section 411.

Figure 5:
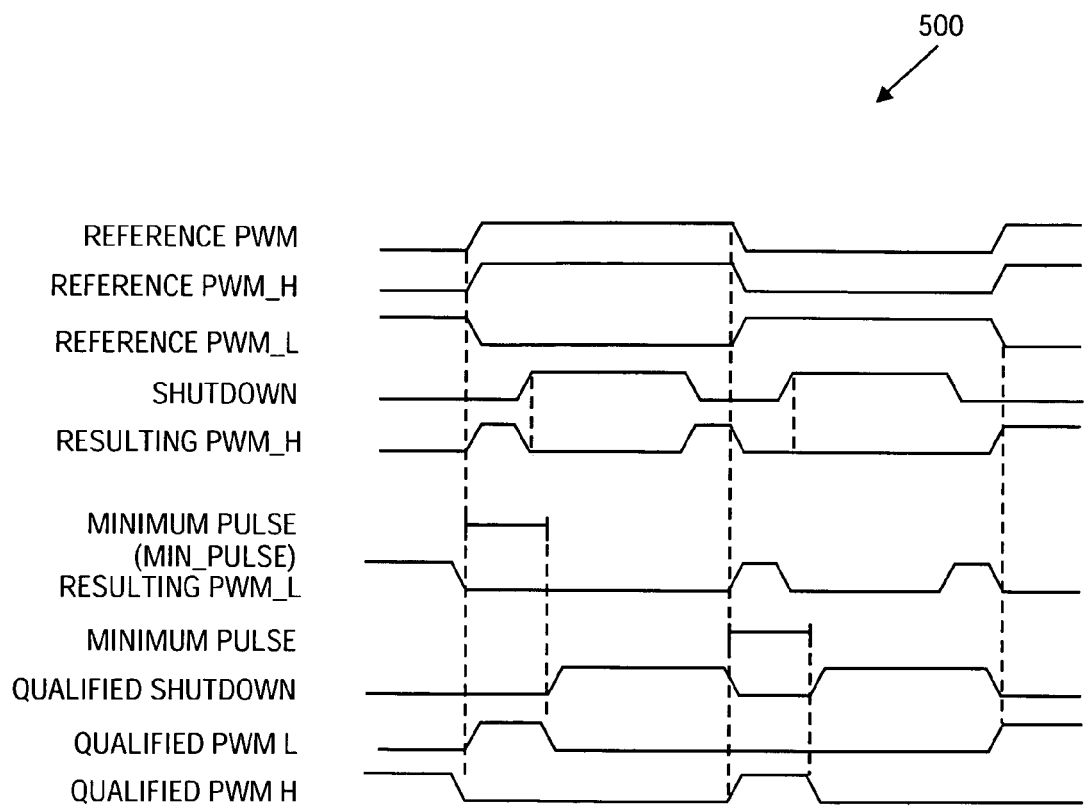
FIG. 5 shows a waveform diagram of various PWM and shutdown signals for the shutdown circuit of FIG. 4.

FIG. 5 illustrates one exemplary waveform diagram 500 for the shutdown circuit 412. Waveforms of diagram 500 are equivalent to the waveform diagram 200 of FIG. 2, except that the PWM signals in diagram 500 are split into H and L components. Although two separate qualified shutdown signals may be used, the two may also be combined into a single qualified shutdown signal, which is shown in FIG. 5. Accordingly, as noted earlier, shutdowns are not allowed to occur within a minimum pulse period after each edge of the reference PWM pulse for respective high and low sides, and the shutdowns are not released until an edge is detected on the respective reference PWM signal.

Thus, an apparatus and method for safely handling asynchronous shutdown of pulsewidth-modulated output is described. The described embodiments above are generally utilized with audio PWM signals, which may be implemented in a digital signal processor (DSP). Thus, circuit 100 is but one embodiment for practicing the invention and that other applicants and embodiments are readily available to practice the asynchronous shutdown scheme of the present invention. Other embodiments may utilize asynchronous delay in one or more of the delay elements. Thus, gate delay and other types of transport delays may be utilized in the delay elements or for flip-flop 315. Similarly, counter 303 may use asynchronous delay (such as RC timing delay) in other embodiments.

However, other embodiments of the invention may be readily practiced in other areas of technology. For example, the invention may be practiced with motor control, switch mode power supplies and lighting ballasts, etc. The safe handling of asynchronous shutdown allows for proper shutdown to be practiced without generating spikes or short pulses (e.g., of less than MIN-PULSE duration), which may disrupt or distort the output or harm components coupled as loads to the output.

We claim:

1. An apparatus, comprising:
   a first circuit to determine a commencement of a signal transition from a first state to a second state for a pulsed signal and to determine a minimum period after the commencement of the signal transition wherein the first circuit includes a counter to count to a predetermined value to determine the minimum period; and
   a second circuit to receive a shutdown signal to initiate shutdown of associated circuitry, said second circuit to delay the shutdown until the minimum period following the commencement of the signal transition has lapsed and to continue the shutdown at least until the pulsed signal has transitioned back to the first state, even if the shutdown signal has terminated.

2. The apparatus of claim 1, wherein the pulsed signal is a pulsewidth modulated signal to control switching of a driver stage.

3. The apparatus of claim 1, wherein the associated circuitry is a driver stage of an amplifier.

4. The apparatus of claim 1, wherein the shutdown signal is an asynchronous signal.

5. The apparatus of claim 1, wherein the pulsed signal is a pulsewidth-modulated signal to drive a switching stage of an audio amplifier and the shutdown signal is an asynchronous signal.

6. The apparatus of claim 1, further comprises a shutdown detection logic circuit coupled to the first and second circuits to monitor a condition, which harms the associated circuitry and to generate the shutdown signal if the condition is detected.

7. An apparatus, comprising:
   a modulator to generate a pulsewidth modulated signal utilized to drive an output stage; and
   a shutdown circuit to receive the pulsewidth modulated signal to determine a commencement of a signal transition from a first state to a second state for the pulsewidth modulated signal and to determine a minimum period after the commencement of the signal transition, said shutdown circuit also to receive a shutdown signal to initiate shutdown of the drive to the output stage and to delay the shutdown until the minimum period following the commencement of the signal transition has lapsed and to continue the shutdown at least until the pulsewidth modulated signal has transitioned back to the first state, even if the shutdown signal has terminated; and wherein said shutdown circuit includes a counter to count to a predetermined value to determine the minimum period.

8. The apparatus of claim 7, wherein the shutdown signal is an asynchronous signal.

9. The apparatus of claim 8, further comprises a noise shaper to receive an audio signal and to filter and quantize the audio signal to control a pulsewidth of the pulsewidth modulated signal from the modulator.

10. The apparatus of claim 8, further comprises a shutdown detection logic circuit coupled to the shutdown circuit to monitor a condition, which harms the output stage and to generate the shutdown signal if the condition is detected.

11. The apparatus of claim 8, wherein the output stage drives an audio device.

12. The apparatus of claim 8, wherein the output stage includes switching transistors to drive an audio load.

13. The apparatus of claim 8, wherein the apparatus is part of a digital signal processor.

14. The apparatus of claim 8, wherein the output stage drives a switching load controlled by the pulsewidth modulated signal.

15. The apparatus of claim 8, wherein the output stage includes a complementary pair of transistors and said shutdown circuit provides separate control of inverted and non-inverted puslewidth modulated signals to drive the complementary pair of transistors.

16. A method to handle asynchronous shutdown, comprising:

determining a commencement of a signal transition from a first state to a second state for a pulsewidth modulated signal;

determining a minimum period after the commencement of the signal transition of the pulsewidth modulated signal wherein the determining of the minimum period is achieved by counting clock pulses to a predetermined count value;

detecting an occurrence of a shutdown signal;

initiating a shutdown of an output stage in response to the shutdown signal and delaying the shutdown until the minimum period following the commencement of the signal transition has lapsed; and continuing the shutdown at least until the pulsewidth modulated signal has transitioned back to the first state, even if the shutdown signal has terminated.

17. The method of claim 16, wherein the occurrence of the shutdown signal occurs asynchronously.

18. The method of claim 17, wherein the pulsewidth modulated signal is used to drive a switching driver.

19. The method of claim 17, wherein the pulsewidth modulated signal is used to drive a switching driver for audio applications.

* * * * *